(12) United States Patent
Nagasaka et al.

(10) Patent No.: US 9,923,364 B2
(45) Date of Patent: Mar. 20, 2018

(54) LOAD DRIVING DEVICE, VEHICLE AIR-CONDITIONING APPARATUS, AND LOAD SHORT-CIRCUIT PROTECTION CIRCUIT

(71) Applicant: MITSUBISHI HEAVY INDUSTRIES AUTOMOTIVE THERMAL SYSTEMS CO., LTD., Kiyosu-shi, Aichi (JP)

(72) Inventors: Keiji Nagasaka, Tokyo (JP); Hidetaka Sato, Aichi (JP)

(73) Assignee: MITSUBISHI HEAVY INDUSTRIES AUTOMOTIVE THERMAL SYSTEMS CO., LTD., Kiyosu-Shi (JP)

( * ) Notice: Subject to any disclaimer, the term of this patent is extended or adjusted under 35 U.S.C. 154(b) by 127 days.

(21) Appl. No.: 14/910,195

(22) PCT Filed: Sep. 1, 2014

(86) PCT No.: PCT/JP2014/072928
§ 371 (c)(1),
(2) Date: Feb. 4, 2016

(87) PCT Pub. No.: WO2015/049946
PCT Pub. Date: Apr. 9, 2015

(65) Prior Publication Data
US 2016/0372914 A1 Dec. 22, 2016

(30) Foreign Application Priority Data
Oct. 3, 2013 (JP) .................................. 2013-208218

(51) Int. Cl.
*H03K 17/08* (2006.01)
*H03K 17/687* (2006.01)
(Continued)

(52) U.S. Cl.
CPC ............ *H02H 3/20* (2013.01); *H02H 1/0061* (2013.01); *H03K 17/0406* (2013.01); *H03K 17/0828* (2013.01); *H03K 2217/0027* (2013.01)

(58) Field of Classification Search
CPC ............ H02H 7/06; H02H 7/093; H02H 3/08; H02H 3/302; H02H 3/02; H02H 3/025;
(Continued)

(56) References Cited

U.S. PATENT DOCUMENTS 5,621,601 A 4/1997 Fujihira et al.
6,570,369 B2* 5/2003 Tamai .................... H02M 3/156
                                                        323/283
(Continued)

FOREIGN PATENT DOCUMENTS

JP      1-238312 A    9/1989
JP      5-21723 A     1/1993
(Continued)

OTHER PUBLICATIONS

Office Action dated Nov. 28, 2017 for related Japanese Patent Application No. 2013-208218 with an English Translation.

*Primary Examiner* — Thienvu Tran
*Assistant Examiner* — Nicolas Bellido
(74) *Attorney, Agent, or Firm* — Birch, Stewart, Kolasch & Birch, LLP

(57) ABSTRACT

The purpose of the present invention is to improve responsiveness to short-circuit detection and rapidly cut off power supply to a load when a short circuit occurs. When a short circuit occurs, voltage exceeding the reference voltage of a comparison circuit is inputted as an input signal from a voltage output circuit, and a high signal is outputted from the comparison circuit. An FET is turned on by the output of the comparison circuit changing to the high signal. Conse- (Continued)

quently, an electric charge stored between the gate and emitter of an IGBT is discharged through a resistor, gate voltage decreases, and thereby the IGBT is turned off. The high signal of the comparison signal is held for a predetermined period by a holding circuit, and the IGBT is maintained in the off state over this period.

8 Claims, 4 Drawing Sheets

(51) Int. Cl.
*H02H 3/20* (2006.01)
*H03K 17/04* (2006.01)
*H03K 17/082* (2006.01)
*H02H 1/00* (2006.01)

(58) Field of Classification Search
CPC ........ H02H 1/0061; H02H 3/20; F01D 21/02; F01K 13/025; G01S 7/4008; H01H 47/32; H03K 17/0406; H03K 17/0828; H03K 2217/0027

See application file for complete search history.

(56) References Cited

U.S. PATENT DOCUMENTS

| | | | | |
|---|---|---|---|---|
| 6,788,128 | B2* | 9/2004 | Tsuchida | H03K 17/0822 327/309 |
| 6,891,707 | B2* | 5/2005 | Hiyama | H03K 17/0406 307/125 |
| 2001/0026429 | A1* | 10/2001 | Fukuda | H03K 17/0828 361/93.9 |
| 2002/0017941 | A1 | 2/2002 | Tsukagoshi et al. | |
| 2002/0135344 | A1 | 9/2002 | Tamai et al. | |
| 2002/0176215 | A1 | 11/2002 | Hiyama et al. | |
| 2008/0304197 | A1* | 12/2008 | Higashi | H03K 17/0822 361/93.7 |
| 2012/0229942 | A1 | 9/2012 | Hussein et al. | |

FOREIGN PATENT DOCUMENTS

| | | | |
|---|---|---|---|
| JP | 10-243545 | A | 9/1998 |
| JP | 10-327056 | A | 12/1998 |
| JP | 2002-290223 | A | 10/2002 |
| JP | 2002-324653 | A | 11/2002 |
| JP | 2002-353795 | A | 12/2002 |
| JP | 2007-306166 | A | 11/2007 |
| JP | 2007306166 | A * | 11/2007 |
| JP | 2008-277351 | A | 11/2008 |
| JP | 2013-159135 | A | 8/2013 |

* cited by examiner

LOAD DRIVING DEVICE, VEHICLE AIR-CONDITIONING APPARATUS, AND LOAD SHORT-CIRCUIT PROTECTION CIRCUIT

TECHNICAL FIELD

The present invention relates to a load driving device that drives a load of a PTC element and the like, a vehicle air-conditioning apparatus including the load driving device, and a load short-circuit protection circuit.

BACKGROUND ART

Examples of known heat sources for heating which are provided in a vehicle air-conditioning apparatus applied to an electric vehicle, a hybrid vehicle, and the like include a PTC heater that uses a positive temperature coefficient thermistor element (hereinafter referred to as "PTC element") as a heating element (refer to Patent Documents 1 and 2, for example).

CITATION LIST

Patent Literature

Patent Document 1: Japanese Unexamined Patent Application Publication No. 2008-277351A
Patent Document 2: Japanese Unexamined Patent Application Publication No. 2013-159135A

SUMMARY OF INVENTION

Technical Problem

Any load such as a PTC element itself may be short-circuited. While conventionally short-circuit protection has been achieved by an overcurrent protection function based on a fuse or a microcomputer, such a function requires a long response time, resulting in the possibility of element damage and the like due to overcurrent caused by a short circuit.

An object of the present invention is to provide a load driving device capable of improving responsiveness to short-circuit detection and rapidly cutting off power supply to a load when a short circuit occurs, a vehicle air-conditioning apparatus including the load driving device, and a load short-circuit protection circuit.

Solution to Problem

A first aspect of the present invention is a load driving device provided with a first switching element that controls a current supply to a load to be on or off, drive means for driving the first switching element by applying, to a conduction control terminal of the first switching element, a voltage signal for controlling the first switching element to be on or off, voltage outputting means for converting a current flowing through the load to a voltage and outputting the voltage, and a load short-circuit protection circuit. The load short-circuit protection circuit is provided with comparison means for detecting a short circuit and outputting a high signal when an output voltage of the voltage outputting means is a predetermined reference voltage or higher, holding means for maintaining the high signal of the comparison means for a predetermined period, a first resistor provided on a control line that connects the drive means and the conduction control terminal of the first switching element, a second resistor provided on the drive means side of the first resistor on the control line, and a second switching element provided on a line connecting an area between the first resistor and the second resistor and a ground, the second switching element being turned on when an output of the comparison means is the high According to the present aspect, the output voltage of the voltage outputting means increases when the load is short-circuited, which causes the comparison means to determine that the output voltage is the reference voltage or higher. When the high signal is outputted from the comparison means, the second switching element is turned on, and the conduction control terminal of the first switching element and the ground are connected through the first resistor. As a result, the voltage of the conduction control terminal of the first switching element decreases, and the first switching element is turned off. This makes it possible to shorten the period from the detection of the short-circuit to the turning off of the first switching element, and thus improve a response speed when a short circuit occurs.

Further, the high signal of the comparison means is maintained for a predetermined period by the holding means, making it possible to turn on the second switching element in a stable manner during that period. This makes it possible to prevent hunting associated with temporary fluctuation of the current flowing through the load and subsequent inversion of the output by the comparison means, for example.

In the load driving device described above, the voltage outputting means may be further provided with a shunt resistor, and a noninverting amplification circuit that amplifies a voltage that appears as a voltage drop across the shunt resistor, and outputs the amplified voltage.

Such use of the shunt resistor makes it possible to detect current flowing through the load as voltage by a simple configuration. Furthermore, such use of the noninverting amplification circuit makes it possible to swiftly amplify the signal. As a result, a current detection speed can be improved.

In the load driving device described above, the holding means may be provided with a diode connected to an output line of the comparison means in a forward direction, a capacitor provided between a cathode side of the diode on the output line and a ground, and a resistor connected in parallel with the capacitor.

With such a configuration, it is possible to maintain the output signal of the comparison means for a predetermined period by a simple configuration.

The load driving device described above is preferably further provided with operation processing means for detecting a short circuit when the output voltage of the voltage outputting means is a predetermined reference voltage or higher, and outputting, to the drive means, a load cutoff signal for turning off the first switching element. In such a load driving device, the predetermined period of the holding means is longer than a period from the detection of the short-circuit to the turning off of the first switching element by the load cutoff signal.

As a result, it is possible to maintain the output of the comparison means as a high signal during the period from the detection of the short-circuit to the turning off of the first switching element via the drive means by the load cutoff signal from the operation processing means. This makes it possible to reliably turn off the first switching element by the load short-circuit protection circuit until the first switching element is turned off by the operation processing means.

In the load driving device described above, a resistance value of the first resistor is preferably set in accordance with an inductance between a power supply and the load.

Peak values and increase rates of a surge voltage and a short-circuit current when a short circuit occurs change in accordance with the inductance between the power supply and the load. At the same time, the resistance value of the first resistor is related to a charge pull-in time of the first switching element. Accordingly, the resistance value of the first resistor is set to an appropriate value in accordance with the peak values and increase rates of the surge voltage and short-circuit current when a short circuit occurs, thereby making it possible to prevent element damage when a short circuit occurs.

In the load driving device described above, the first resistor and the second resistor may be formed by one variable resistor integrated circuit (IC), and the resistance value of the first resistor and a resistance value of the second resistor may be set by adjusting a voltage division ratio according to a digital instruction from the microcomputer.

As a result, manual adjustment of the first resistor and the second resistor is no longer needed.

A second aspect of the present invention is a vehicle air-conditioning apparatus provided with a heater including a PTC element, and the load driving device described above for driving the PTC element.

A third aspect of the present invention is a load short-circuit protection circuit applied to a load driving device. The load driving device is provided with drive means for driving the first switching element by applying, to a conduction control terminal of the first switching element, a voltage for controlling the first switching element to be on or off, voltage outputting means for converting a current flowing through the load to a voltage and outputting the voltage, and operation processing means for detecting a short circuit and outputting an off control signal to the drive means when the voltage outputting means exceeds a predetermined reference voltage. Such a load short-circuit protection circuit is provided with comparison means for detecting a short circuit and outputting a high signal when an output voltage of the voltage outputting means is a predetermined reference voltage or higher, holding means for maintaining the high signal of the comparison means for a predetermined period, a first resistor provided on a control line that connects the drive means and the conduction control terminal of the first switching element, a second resistor provided on the drive means side of the first resistor on the control line, and a second switching element provided on a line that connects an area between the first resistor and the second resistor and the ground, the second switching element being turned on when the comparison means outputs the high signal.

Advantageous Effects of Invention

According to the present invention, it is possible to improve responsiveness when a short circuit is detected in a load or the like, and rapidly cut off power supply to the load. As a result, it is possible to suppress element damage caused by overcurrent and surge voltage.

DESCRIPTION OF EMBODIMENTS

[First Embodiment]

The following describes a load driving device, a vehicle air-conditioning apparatus including the load driving device, and a load short-circuit protection circuit according to a first embodiment of the present invention with reference to the drawings.

Figure 1:
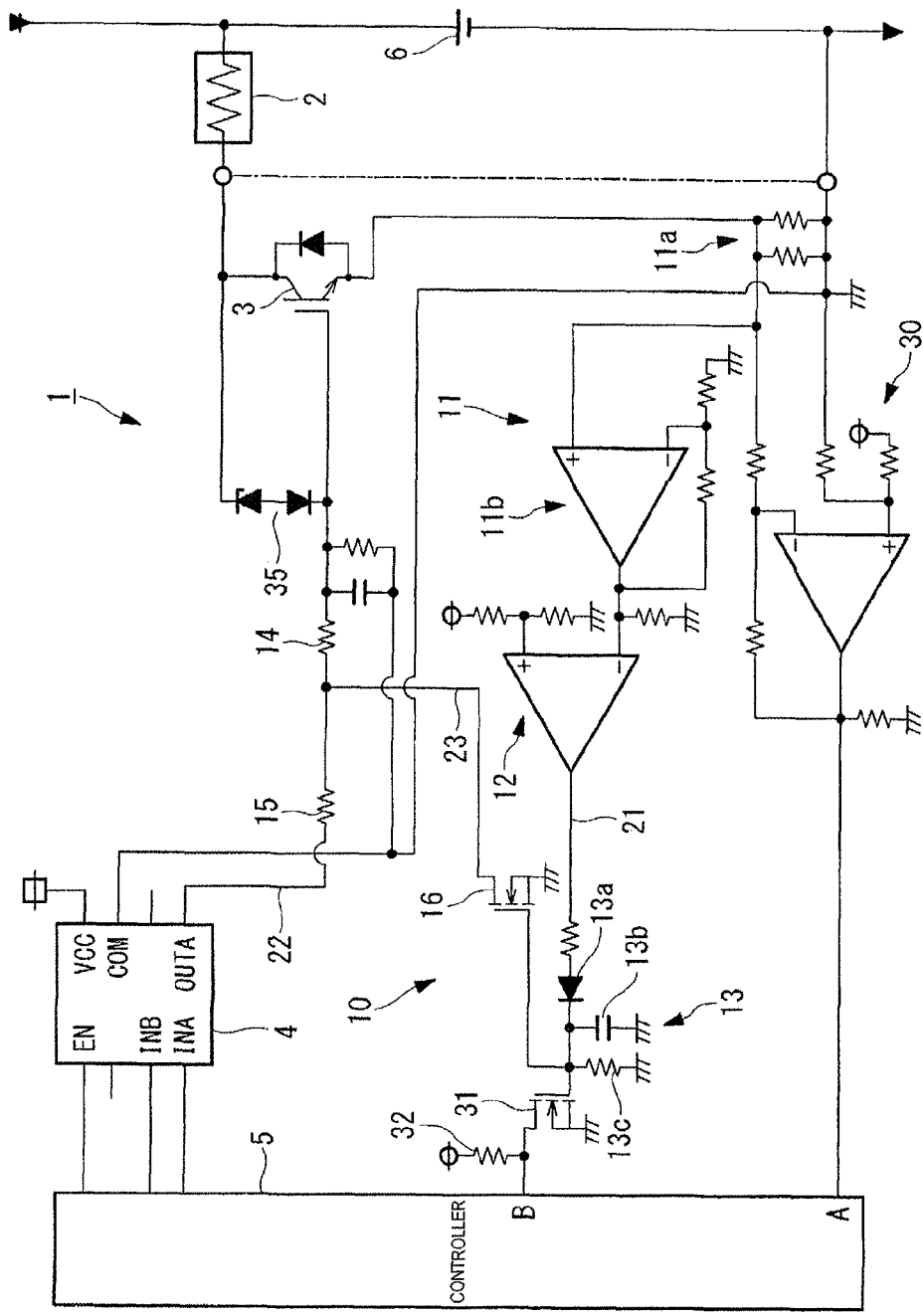
FIG. 1 is a schematic configuration diagram of a load driving device according to a first embodiment of the present invention.

FIG. 1 is a schematic configuration diagram of the load driving device according to the first embodiment of the present invention. While FIG. 1 illustrates a PTC element of a PTC heater mounted to a vehicle air-conditioning apparatus as an example of a load, the load is not particularly limited thereto.

As illustrated in FIG. 1, a load driving device 1 includes an insulated gate bipolar transistor (IGBT; first switching element) 3 that controls a current supply to a PCT element 2 serving as a load to be on or off, a drive circuit 4 that drives the IGBT 3, a controller 5 that controls the drive circuit 4, and a load short-circuit protection circuit 10 as main components.

Figure 4:
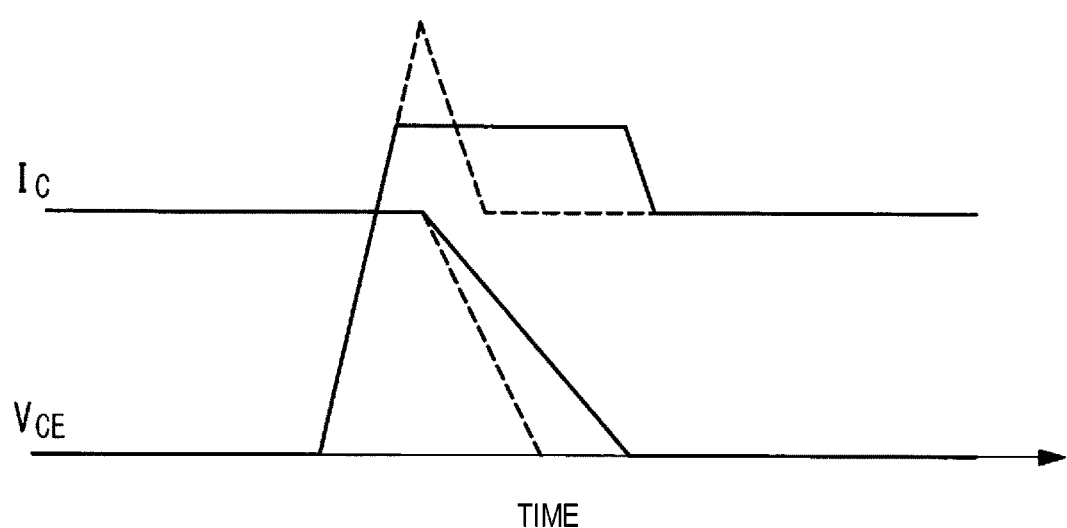
FIG. 4 is a diagram illustrating a comparison between a voltage between a collector and an emitter and a collector current when an active clamp circuit is provided, and a voltage between the collector and the emitter and a collector current when the active clamp circuit is not provided.

In the IGBT 3, an active clamp circuit 35 formed by a Zener diode and a diode is provided between a collector and a gate. Provision of the active clamp circuit 35 makes it possible to suppress a surge voltage and alleviate a current change rate as illustrated in FIG. 4. In FIG. 4, the dashed lines indicate a current waveform and a voltage waveform when the active clamp circuit 35 is not provided, and the solid lines indicate a current waveform and a voltage waveform when the active clamp circuit 35 is provided.

The drive circuit 4 drives the IGBT 3 by applying, to a gate (conduction control terminal) of the IGBT 3, a voltage signal for controlling the IGBT 3 to be on or off.

Another power device may be used in place of the IGBT 3. Examples of other power devices include a field-effect transistor (FET) and a metal-oxide-semiconductor FET (MOSFET).

The controller 5, which is, for example, a microcomputer, achieves various functions (such as PTC element on/off control and a short-circuit protection function) by loading a program recorded in an auxiliary memory device into a main memory device and executing the program via a central processing unit (CPU). Normal PTC element on/off control can be achieved through the use of known technology, for example.

The short-circuit protection function outputs a load cutoff signal for turning off the PTC element 2 to the drive circuit 4 when an input signal for short-circuit detection input to an input terminal A exceeds a predetermined reference voltage, for example.

The load short-circuit protection circuit 10 includes a voltage output circuit 11, a comparison circuit 12, a holding circuit 13, a first resistor 14, a second resistor 15, and an FET (second switching element) 16 as main components.

The voltage output circuit 11 converts a current flowing through the PTC element 2 to a voltage, and outputs the voltage. The voltage output circuit 11 includes, for example, a shunt resistor 11a, and a noninverting amplification circuit 11b that amplifies a voltage that appears as a voltage drop across the shunt resistor 11a, and outputs the amplified voltage. The comparison circuit 12 detects a short circuit and outputs a high signal when the output voltage of the voltage output circuit 11 is a predetermined reference voltage or higher. For example, the reference voltage is set to 5 V, and the comparison circuit 12 outputs a 5-V output signal as the high signal when the output voltage from the voltage output circuit 11 is 5 V or higher.

The holding circuit 13 holds the high signal of the comparison circuit 12 for a predetermined period. Specifically, the holding circuit 13 includes a diode 13a connected to an output line 21 of the comparison circuit 12 in a forward direction, a capacitor 13b provided between a cathode side of the diode 13a on the output line 21 and a ground, and a resistor 13c connected in parallel with the capacitor 13b.

Here, the predetermined period is longer than a period from short-circuit detection by the controller 5 to activation of the drive circuit 4 and subsequent turning off of the IGBT 3, and a time constant of the holding circuit 13, that is, an electrostatic capacitance of the capacitor 13b and a resistance value of the resistor 13c, is determined in accordance with this predetermined period.

The first resistor 14 is provided on a control line 22 that connects the drive circuit 4 and the gate of the IGBT 3. Further, the second resistor 15 is provided on the drive circuit 4 side of the first resistor 14 on this control line 22. The details of the resistance values of the first resistor 14 and the second resistor 15 will be described later.

The FET 16 is provided on a line 23 that connects an area between the first resistor 14 and the second resistor 15 and the ground, and is turned on when the comparison circuit 12 outputs the high signal. Another semiconductor switching element, for example, may be used in place of the FET 16. In this case, the element must be voltage sensitive in the same manner as the FET 16.

The load driving device 1 further includes an amplification circuit 30 for amplifying a voltage that appears across the shunt resistor 11a and inputting the amplified voltage to the input terminal A of the controller 5, an FET 31 for inputting a predetermined voltage signal to an input terminal B of the controller 5 when the comparison circuit 12 outputs the high signal, and a pull-up resistor 32.

In such a load driving device 1, when the PTC element 2 is short-circuited, causing introduction of overcurrent, the voltage drop across the shunt resistor 11a increases, and this voltage value is amplified by the noninverting amplification circuit 11b and input to the comparison circuit 12. In the comparison circuit 12, the input signal is determined to be higher than the reference voltage, and the high signal is output. As a result, a predetermined voltage (5 V, for example) is applied to the output line 21 of the comparison circuit 12, and the FETs 16, 31 are turned on. The FET 16 that has been turned on allows a current to flow from the gate of the IGBT 3 through the first resistor 14. Consequently, an electric charge stored between the gate and the emitter of the IGBT 3 is discharged and the gate voltage decreases, thereby turning off the IGBT 3.

In the protection circuit 13, the high signal outputted from the comparison circuit 12 causes the electric charge to be stored into the capacitor 13b, and the output of the comparison circuit 12 is maintained at a high level until this electric charge is discharged through the resistor 13c. Accordingly, the IGBT 3 is maintained in the off state over this period.

Meanwhile, the voltage across the shunt resistor 11a is amplified by the amplification circuit 30 and input to the input terminal A of the controller 5. In the controller 5, the voltage value input from the input terminal A and the predetermined reference value are compared, and a short circuit is detected. As a result, an interrupt signal occurs, and a load cutoff signal for turning off the IGBT 3 is outputted to the drive circuit 4. The drive circuit 4 is activated to turn off the IGBT 3 on the basis of the load cutoff signal. As a result, the IGBT 3 is turned off on the basis of the load cutoff signal from the controller 5.

Further, after the IGBT 3 is turned off on the basis of an instruction from the controller 5, the holding circuit 13 stops to maintain the high signal, which causes the output of the comparison circuit 12 to be a low signal.

Figure 2:
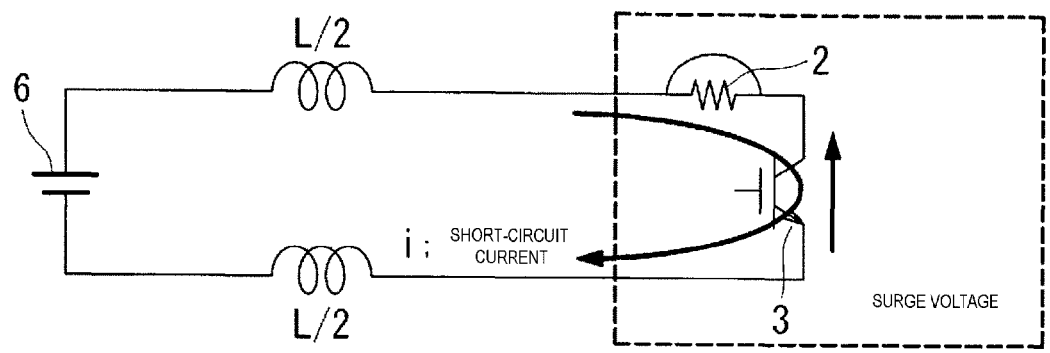
FIG. 2 is a schematic diagram of a closed circuit that supplies a current to a PCT element from a power supply.

Next, the resistance values of the first resistor 14 and the second resistor 15 will be described with reference to FIG. 2. FIG. 2 is a schematic diagram of a closed circuit that supplies a current to the PCT element 2 from a power supply 6.

In the PTC element 2 of the PTC heater mounted to the vehicle air-conditioning apparatus, power is supplied from the power supply (an in-vehicle high-voltage battery, for example) 6 through a cable. Here, a cable length varies in accordance with a vehicle type, and thus an inductance L specific to the vehicle occurs between the PTC element 2 and the power supply 6.

In the circuit illustrated in FIG. 2, a short-circuit current i is introduced when the PTC element 2 is short-circuited. When the IGBT 3 is turned off in this state, an Ldi/dt surge voltage occurs between the collector and the emitter of the IGBT 3.

Figure 3:
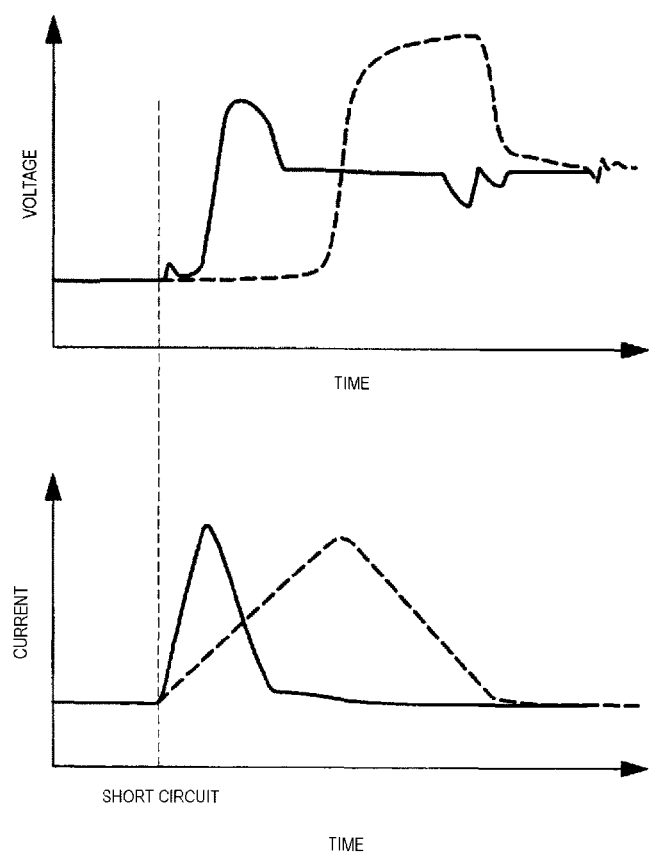
FIG. 3 is a diagram illustrating a comparison between a surge voltage and a short-circuit current waveform when an inductance between the power supply and the PTC element is relatively large, and a surge voltage and a short-circuit current waveform when the inductance is relatively small.

At this time, when the cable length is relatively short and the inductance L is relatively small, for example, the short-circuit current i sharply rises, in other words, a slope of the current becomes relatively large, causing the peak value to become relatively large, as illustrated by the solid line in FIG. 3. Accordingly, when the inductance L is relatively small, the resistance of the first resistor 14 is preferably set to a smaller value so as to cut off the IGBT 3 as soon as possible, in other words, to quickly discharge the electric charge stored between the gate and the emitter of the IBGT 3. When the first resistor 14 is set to a smaller value, the value of the current introduced to the line 23 increases, and the electric charge stored in the IGBT 3 is quickly discharged.

Conversely, when the cable length is relatively long and the inductance L is relatively large, the short-circuit current i gently rises, but the surge voltage that occurs between the collector and the emitter of the IGBT 3 increases, as illustrated by the dashed line in FIG. 3. As a result, when the inductance L is relatively large, the resistance of the first resistor 14 is preferably set to a larger value so as to cut off the IGBT 3 as slowly as possible. When the first resistor 14 is set to a larger value, the value of the current introduced to the line 23 decreases, and the electric charge stored in the IGBT 3 is gradually discharged.

Thus, the resistance value of the first resistor 14 is preferably adjusted for each vehicle, taking the inductance L (refer to FIG. 2) between the PTC element 2 and the power supply 6 that supplies a current to the PTC element 2, in other words, the cable length and the like, into consideration. For example, the resistance value of the first resistor 14 is set to an appropriate value by performing simulations and pre-shipment tests so that the IGBT 3 does not break down due to the surge voltage, and the peak value of the short-circuit current does not exceed the allowable current of the IGBT 3 and the PTC element.

It should be noted that, the control line 22 that connects the gate of the IGBT 3 and the drive circuit 4 needs to have a resistance value regulated for normal switching. Accordingly, a value obtained by subtracting the resistance value of the first resistor 14 from this regulated value is set as the resistance value of the second resistor 15.

The inductance L described above is cable length dependent. Accordingly, the value may be set by preparing information (a table, for example) associating the cable length and the first resistor 14 in advance, and acquiring the resistance value of the first resistor 14 corresponding to the cable length of each vehicle from this information.

As described above, according to the load driving device, the vehicle air-conditioning apparatus including the load driving device, and the load short-circuit protection circuit according to the present embodiment, when a load is short-circuited, the short circuit is rapidly detected in the voltage output circuit 11 and the comparison circuit 12, and an high signal is outputted from the comparison circuit 12. As a result, the FETs 16 and 31 are turned on, and the electric charge between the gate and the emitter of the IGBT 3 is discharged through the first resistor 14 and the like. This makes it possible to rapidly turn off the IGBT 3.

For example, when the short-circuit protection function of the controller 5 is used, that is, with the short-circuit protection based on the load cutoff signal described above, approximately 10 μS is required from short-circuit detection to the turning off of the IGBT 3. In contrast, when the load short-circuit protection circuit 10 according to the present embodiment is used, the IGBT 3 can be turned off in approximately 2 to 3 μS.

Thus, use of the load short-circuit protection circuit 10 according to the present embodiment makes it possible to swiftly detect a short circuit and increase the response speed from short circuit occurrence to the turning off of the IGBT 3.

[Second Embodiment]

While the first resistor 14 and the second resistor 15 are provided as individual resistors in the first embodiment, the first resistor 14 and the second resistor 15 may be formed by one variable resistor IC, for example. In this case, the resistance values of the first resistor 14 and the second resistor 15 are set by adjusting a voltage division ratio by a digital instruction from the microcomputer.

[Third Embodiment]

Figure 5:
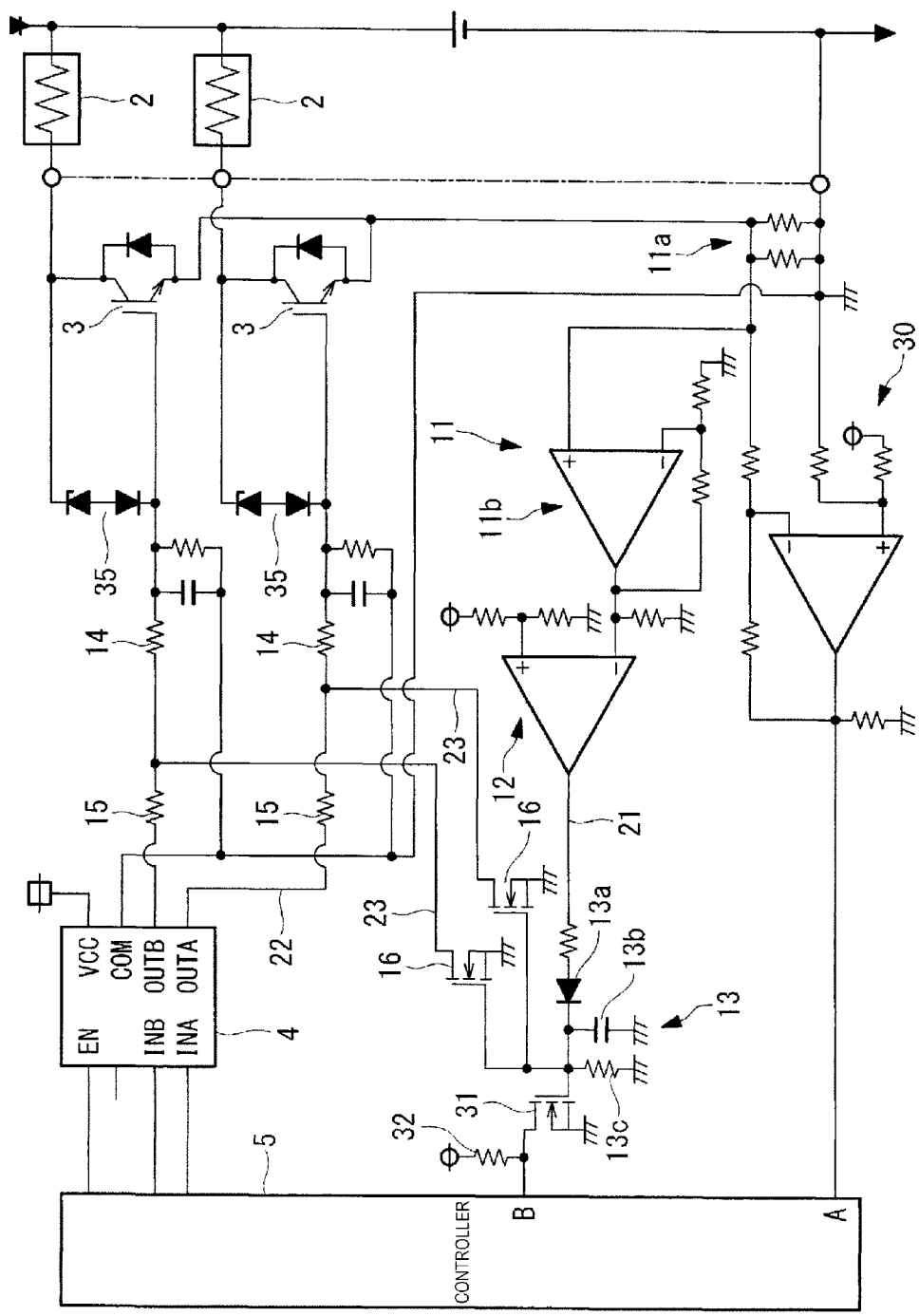
FIG. 5 is a diagram illustrating an example of a configuration of the load driving device when a plurality of PTC elements are driven.

While in the description of the first embodiment, one PTC element 2 is provided, the number of PTC elements 2 installed is not limited. For example, when the plurality of PTC elements 2 are provided as illustrated in FIG. 5, an IGBT 3 is provided to each of the PTC elements 2. In this case, while the first resistor 14, the second resistor 15, and the FET 16 need to be provided to each of the IGBTs 3, a common circuit may be used for the voltage output circuit 11, the comparison circuit 12, and the holding circuit 13.

The present invention has been described above, but the scope of the present invention is not limited to only the aforementioned embodiments, and various modifications can be implemented without deviating from the intent of the invention.

REFERENCE SIGNS LIST

1 Load driving device
2 PTC element
3 IGBT
4 Driving circuit
5 Controller
10 Load short-circuit protection circuit
11 Voltage output circuit
11a Shunt resistor
11b Noninverting amplification circuit
12 Comparison circuit
13 Holding circuit
13a Diode
13b Capacitor
13c Resistor
14 First resistor
15 Second resistor
16 FET

The invention claimed is:

1. A load driving device comprising:
a first switching element that controls a current supply to a load to be on or off;
drive means for driving the first switching element by applying, to a conduction control terminal of the first switching element, a voltage signal for controlling the first switching element to be on or off;
voltage outputting means for converting a current flowing through the load to a voltage, and outputting the voltage; and
a load short-circuit protection circuit;
the load short-circuit protection circuit including:
comparison means for detecting a short circuit and outputting a high signal when an output voltage of the voltage outputting means is a predetermined reference voltage or higher;
holding means for maintaining the high signal of the comparison means for a predetermined period;
a first resistor provided on a control line that connects the drive means and the conduction control terminal of the first switching element;
a second resistor provided on .the drive means side of the first resistor on the control line; and
a second switching element provided on a line that connects an area between the first resistor and the second resistor and a ground, the second switching element being turned on when the comparison circuit outputs the high signal.

2. The load driving device according to claim 1, wherein the voltage outputting means include:
a shunt resistor; and
a noninverting amplification circuit that amplifies a voltage that appears as a voltage drop across the shunt resistor and outputs the amplified voltage.

3. The load driving device according to claim 1, wherein the holding means include:
a diode connected to an output line of the comparison means in a forward direction;
a capacitor provided between a cathode side of the diode on the output line and a ground; and
a resistor connected in parallel with the capacitor.

4. The load driving device according to claim 1, further comprising: operation processing means for detecting a short circuit and outputting, to the drive means, a load cutoff signal for turning off the first switching element when an output voltage of the voltage outputting means is the predetermined reference voltage or higher;

the predetermined period of the holding means being longer than a period from the detection of the short circuit to the turning off of the first switching element by the load cutoff signal.

5. The load driving device according to claim 3, wherein a resistance value of the first resistor is set in accordance with an inductance between a power supply and the load.

6. The load driving device according to claim 5, wherein the first resistor and the second resistor are formed by one variable resistor IC, and the resistance value of the first resistor and a resistance value of the second resistor are set by adjusting a voltage division ratio according to a digital instruction from a microcomputer.

7. A vehicle air-conditioning apparatus comprising:
a heater including a PTC element; and
the load driving device described in claim 1 for driving the PTC element.

8. A load short-circuit protection circuit applied to a load driving device, the load driving device including drive means for driving a first switching element by applying, to a conduction control terminal of the first switching element, a voltage for controlling the first switching element to be on or off, voltage outputting means for converting a current flowing through the load to a voltage and outputting the voltage, and operation processing means for detecting a short circuit and outputting an off control signal to the drive means when an output voltage of the voltage outputting means is a predetermined reference voltage or higher, the load short-circuit protection circuit comprising:
comparison means for detecting a short circuit and outputting a high signal when the output voltage of the voltage outputting means is the predetermined reference voltage or higher;
holding means for maintaining the high signal of the comparison means for a predetermined period;
a first resistor provided on a control line that connects the drive means and the conduction control terminal of the first switching element;
a second resistor provided on the drive means side of the first resistor on the control line; and
a second switching element provided on a line that connects an area between the first resistor and the second resistor and a ground, the second switching element being turned on when the comparison circuit outputs the high signal.

* * * * *